United States Patent [19]

Morii et al.

[11] 4,263,674

[45] Apr. 21, 1981

[54] MULTI-BAND VOLTAGE VARIABLE CAPACITANCE TUNER HAVING AUTOMATIC AND MANUAL TUNING OPERATIONS

[75] Inventors: Kokichi Morii, Chigasaki; Hajime Shichijo, Fujisawa; Kohei Haneishi, Tokyo, all of Japan

[73] Assignees: Sony Corporation; Alps Electric Co., Ltd., both of Tokyo, Japan

[21] Appl. No.: 96,375

[22] Filed: Nov. 21, 1979

[30] Foreign Application Priority Data

Nov. 25, 1978 [JP] Japan .............................. 53-145516

[51] Int. Cl.³ .......................... H04B 1/26; H03J 3/18; H03J 5/32
[52] U.S. Cl. ....................................... 455/175; 334/3; 334/15; 334/87; 455/176
[58] Field of Search ........................... 334/3, 15, 87, 7; 116/241, 242, 259, 261–263; 455/154, 157, 160, 169, 175, 176, 179, 180, 186, 188, 195, 196, 199

[56] References Cited

U.S. PATENT DOCUMENTS

| | | | |
|---|---|---|---|
| 3,581,252 | 5/1971 | Sacher | 334/15 |
| 3,755,740 | 8/1973 | Maugans | 455/176 |
| 4,138,653 | 2/1979 | Midgley | 334/15 |

*Primary Examiner*—Paul L. Gensler
*Attorney, Agent, or Firm*—Lewis H. Eslinger; Alvin Sindebrand

[57] ABSTRACT

A tuning apparatus includes a dial plate marked with broadcast frequencies thereon, a guide shaft provided in parallel with the dial plate, a substrate having a resistive layer thereon, the resistive layer having varying resistance values distributed therealong which correspond to the broadcast frequencies on the dial plate, the resistive layer being supplied with a DC voltage at opposite ends thereof, a plurality of markers, each slidably disposed with respect to the dial plate to indicate a predetermined broadcast frequency, and each having a first engaging portion and a first electrically conductive slide element for slidably contacting the resistive layer to detect a predetermined DC voltage in response to the location of the markers, a mounting member slidably disposed on the guide shaft in parallel with the dial plate, and including a display member extending therefrom toward the dial plate to indicate a manually selected broadcast frequency, a second electrically conductive slide element for slidably contacting the resistive layer to detect a predetermined DC voltage in response to the location of the mounting member, and a sleeve member slidably mounted on the guide shaft and including a projecting portion adapted to engage the engaging portions of the markers, and a switching circuit supplied with the DC voltages from the first and second slide elements and selectively supplying one of the DC voltages to a tuning circuit as a tuning control voltage.

10 Claims, 4 Drawing Figures

MULTI-BAND VOLTAGE VARIABLE CAPACITANCE TUNER HAVING AUTOMATIC AND MANUAL TUNING OPERATIONS

BACKGROUND OF THE INVENTION

The present invention relates generally to a tuning apparatus and, more particularly, is directed to a tuning apparatus having automatic and manual tuning operations.

One type of a presettable tuning apparatus known in the art is shown in the U.S. Pat. No. 4,167,702, entitled "TUNING APPARATUS". In this tuning apparatus, markers corresponding to a desired number of broadcast stations can be preset in relation to a dial plate having broadcast frequencies marked thereon. However, each time that it is desired to receive a preset station, the tuning knob in this apparatus must be rotated to position the pointer mount assembly into alignment with a previously preset marker. That is, there is no automatic reception of a preset station. Also, this apparatus uses a mechanical variable capacitor to control the frequency of a local oscillator, resulting in a complicated and expensive construction of the tuning apparatus. Although an electronic tuner, in which a voltage-variable capacitance element is used at the front end portion of the tuner, is generally known, this type of tuner does not include a dial plate and markers which can preset a desired broadcast station.

Also known in the art are presettable radio receivers for selecting two or more broadcasting stations beforehand, in which a desired broadcasting station can be selected from among the preselected broadcasting stations by depressing a push-button or the like. However, such presettable radio receivers employ a number of μ-tuning elements corresponding to the number of desired broadcasting stations to be selected. Accordingly, these devices are of a complex construction, are difficult to adjust, and typically involve high manufacturing costs.

OBJECTS AND SUMMARY OF THE INVENTION

Accordingly, an object of this invention is to provide a tuning apparatus that avoids the above-described difficulties encountered with the prior art.

More particularly, it is an object of this invention to provide a tuning apparatus in which a desired broadcast station can be preset by a marker, such that a tuning control voltage is instantaneously detected from the marker upon the actuation of a switch.

It is another object of this invention to provide a tuning apparatus which is simple in construction and adapted to preset two or more broadcasting stations.

It is further object of this invention to provide a tuning apparatus which may preset a radio receiver having two or more bands, in a simple and convenient manner.

In accordance with an aspect of this invention, a tuning apparatus includes a dial plate marked with broadcast frequencies thereon and a substrate having a resistive layer thereon, the resistive layer having varying resistance valves distributed therealong which correspond to the broadcast frequencies on the dial plate. The resistive layer is also supplied with a DC voltage at opposite ends thereof. A plurality of markers are each slidably disposed with respect to the dial plate to indicate a predetermined broadcast frequency, each having a first electrically conductive slide element for slidably contacting the resistive layer to detect a predetermined DC voltage in response to the location of the markers. A mounting member is also slidably disposed in parallel with the dial plate, and includes a display member extending therefrom toward the dial plate to indicate a manually selected broadcast frequency and a second electrically conductive slide element for slidably contacting the resistive layer to detect a predetermined DC voltage in response to the location of the mounting member. A switching circuit, supplied with the DC voltages from the first and second slide elements, selectively supplies one of the DC voltages to a tuning circuit as a tuning control voltage.

The above, and other, objects, features and advantages of the invention, will be apparent in the following detailed description of an illustrative embodiment which is to be read in conjunction with the accompanying drawings.

DETAILED DESCRIPTION OF A PREFERRED EMBODIMENT

Figure 1:
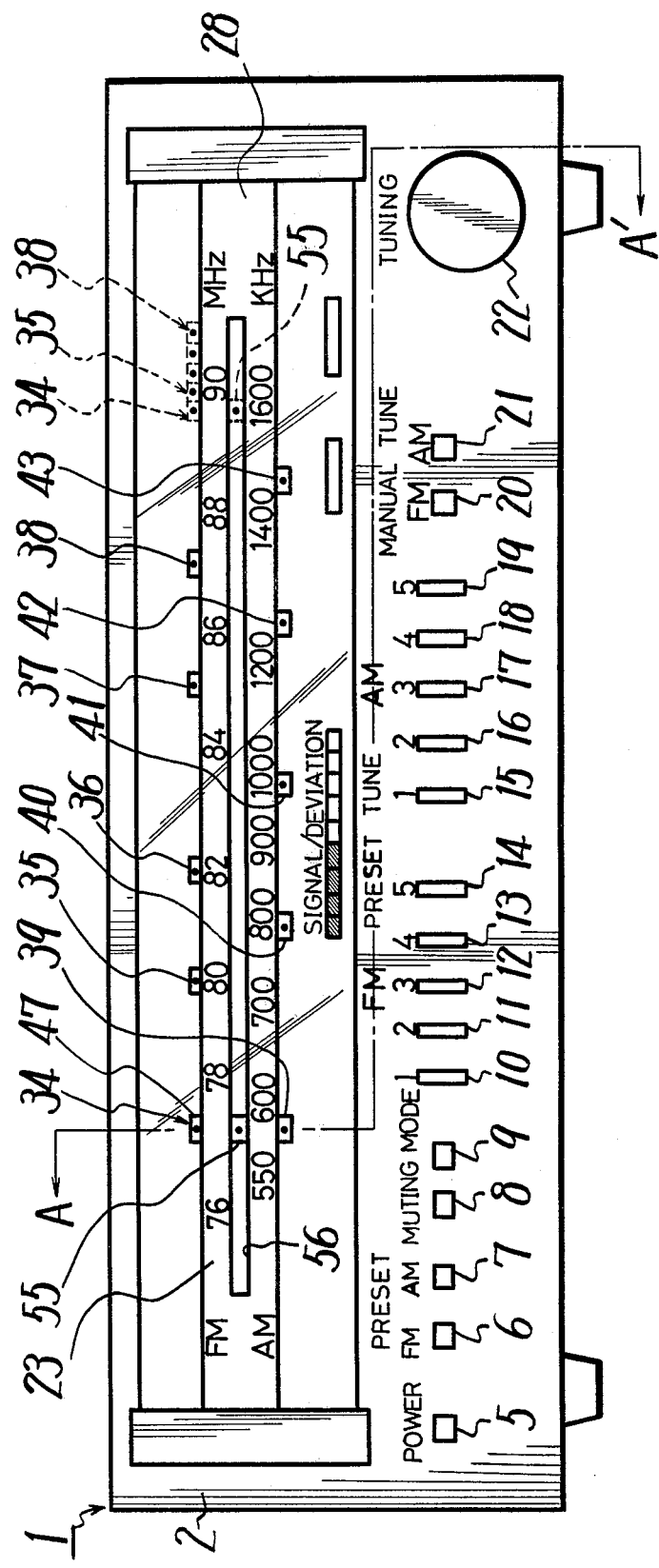
FIG. 1 is a front view of a radio receiver employing a tuning apparatus according to the present invention.
Figure 2:
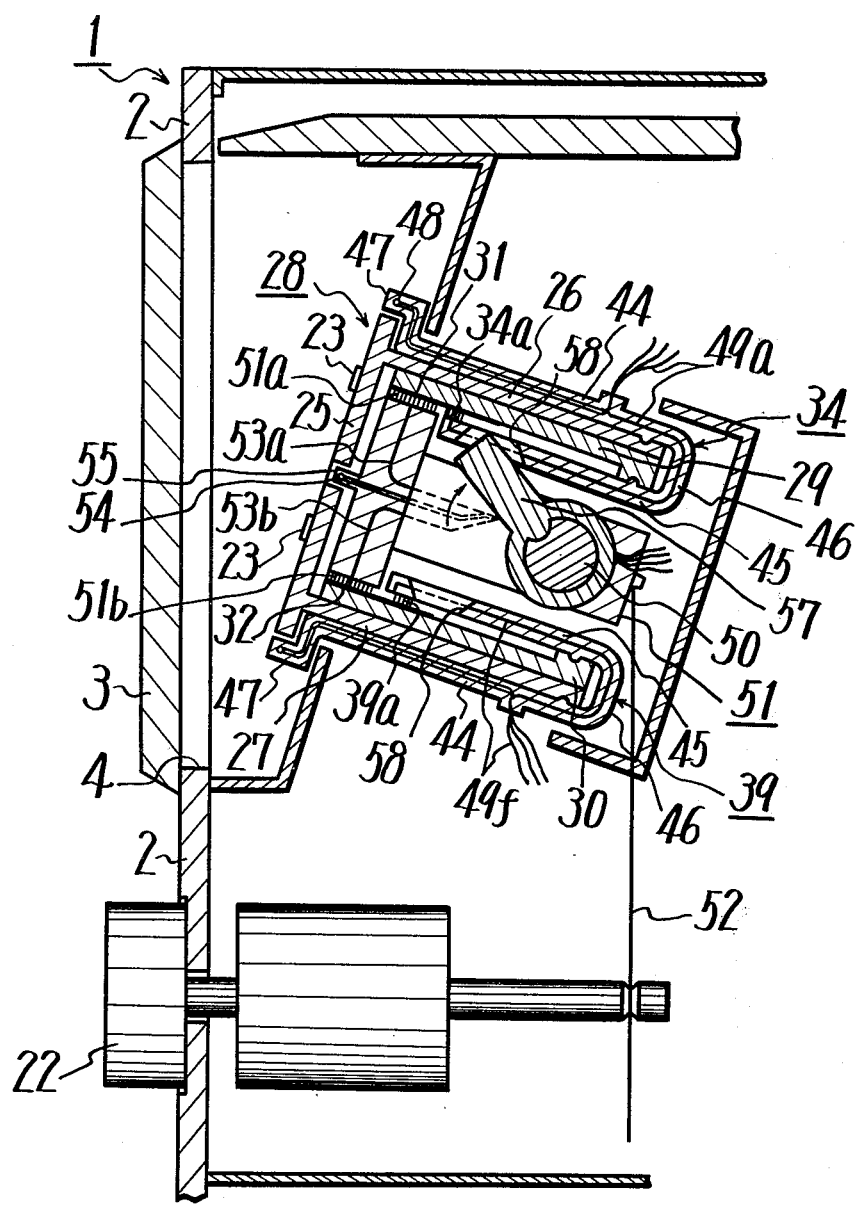
FIG. 2 is a cross-sectional view of the tuning apparatus of FIG. 1, taken on the line A-A' thereof.

Referring to the drawings in detail, and initially to FIGS. 1 and 2 thereof, a radio receiver 1 employing the tuning apparatus of the present invention includes a front panel 2 which forms a front wall of a casing of radio receiver 1. A window 4 of a rectangular configuration is provided in panel 2 through which the interior of the radio receiver 1 can be viewed through the medium of a transparent glass plate 3 attached to the front of panel 2. On the lower portion of front panel 2 and below window 4, a plurality of switches, preferably of the push-button type, are provided, including a power or ON/OFF switch 5, FM and AM preset switches 6 and 7, a muting switch 8, a mode switch 9 for effecting stereo or monaural reproduction, a first series of five push-button switches 10–14 for automatically selecting one of five preset FM broadcast stations, a second series of five push-button switches 15–19 for automatically selecting one of five preset AM broadcast stations, manual push button switches 20 and 21 for manually selecting a desired FM or AM broadcast station, and a tuning knob 22. Push-button switches 10–21 are preferably ganged such that the depression of one switch automatically releases or deactivates the remaining switches.

Figure 3:
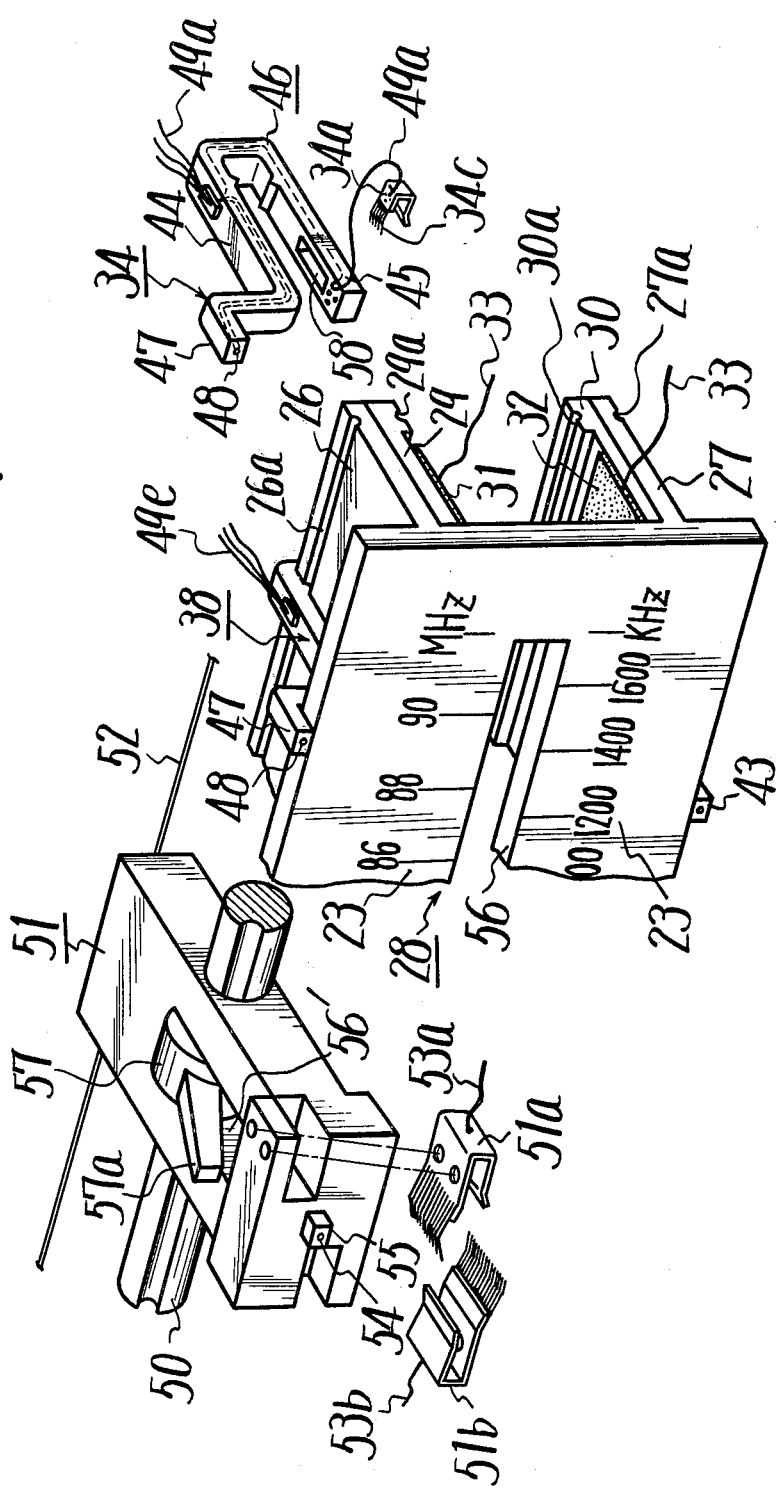
FIG. 3 is an enlarged, partially blown-up, perspective view of a portion of the tuning apparatus according to the present invention shown in FIGS. 1 and 2.

As shown in FIGS. 2 and 3, a broadcast station indicator member 28, including a dial plate 25, carrying gradations or markings 23 distributed longitudinally thereover for indicating the various broadcast frequencies to be picked up, is situated behind front panel 2 and can be viewed through glass plate 3. Indicator member 28 is further formed with upper and lower guide rails 26 and 27 which project rearwardly from the back surface of dial plate and have longitudinal grooves 26a and 27a at the free ends of the respective outer surfaces thereof. A pair of plate-like substrates 29 and 30 are repsectively fixed to the opposing inner surfaces of upper and lower guide rails 26 and 27 and have respective inner longitudinal grooves 29a and 30a in alignment with grooves 26a and 27a. The apparatus further includes a pair of resistive layers 31 and 32, having resistance values varying in the longitudinal direction and corresponding to the respective frequencies of station markings 23, resistive layers 31 and 32 being provided on the opposing inner surfaces of substrates 29 and 30, as shown in FIG. 3. That is, the different resistance values of resistive layers 31 and 32 in the longitudinal direction thereof are associated with respective ones of markings 23, which markings display the respective received frequencies of the FM and AM stations. In this regard, each resistive layer 31 and 32 is formed so as to exhibit a resistance characteristic, preferably of a non-linear nature, which varies in accordance with the non-linear voltage-capacitance characteristic of a voltage-variable capacitance element, such as a variable capacitance diode or the like. Both ends of resistive layers 31 and 32 are connected to a DC voltage source by lead wires 33, shown in FIG. 3.

A first set of five markers 34–38, associated with the FM broadcast stations, and a second set of five markers 39–43, associated with the AM broadcast stations, are slidably movable along rails 26 and 27 and are adapted to be preset at fixed positions along guide rails 26 and 27 for automatic selection of desired FM and AM broadcast stations. As shown in FIGS. 2 and 3, each marker 34–43 includes, by way of example, a marker body portion 46 of a U-shaped cross-section, having an upper side plate 44 and a lower side plate 45, and an L-shaped pointer member 47 extending toward front panel 2 from the free end of upper side plate 44, for pointing to or indicating the received frequency or marking 23 on dial plate 25. Side plates 44 and 45 include inwardly facing ribs 44a and 45a, respectively, which ribs are adapted to ride within longitudinal grooves 26a, 29a and 27a, 30a. That is, markers 34–38 are positioned to ride within grooves 26a, 29a, and markers 39–43 are positioned to ride within grooves 27a, 30a in the longitudinal directions of guide rails 26 and 27. Each lower side plate 45 further includes an aperture 58 near the free end thereof. Markers 34–43 may be molded in a unitary structure and may be made from any suitable material, such as a lightweight but durable plastic.

Detachable sliding members 34a–43a are provided on the lower side plates 45 of the respective markers 34–43 and are adapted to slide on resistive layers 31 and 32 as markers 34–43 slide within grooves 26a, 29a and 27a, 30a. In this regard, each sliding member 34a–43a includes a conductive brush portion 34c–43c aligned in the longitudinal direction of resistive layers 31 and 32 and which is bent so as to have an apex which slides along resistive layers 31 and 32. From this arrangement, separately derived or detected voltages are obtained which correspond to the received broadcast frequencies at which markers 34–43 are preset and which are determined by the contact position of slidable members 34a to 43a on resistive layers 31 and 32. Lead wires 49a–49j for detecting the voltages are respectively connected to slidable members 34a to 43a and serve to supply the predetermined voltages which are detected at the contact position of resistive layers 31 and 32, to a voltage-variable capacitance element, for example, a variable capacitance diode, through a change-over switch, which will hereinafter be described. A light emitting element 48, such as light emitting diode (LED), lamp, or like element, is fixed to the free end of each pointer member 47 for indicating when the receiver is tuned to a desired FM or AM station, that is, when sliding members 34a–43a are in electrical contact with resistive layers 31 and 32 at a desired position thereof.

Behind and parallel to dial plate 25 and between upper and lower guide rails 26 and 27, a guide shaft 50 is rotatably supported at either end by conventional bearings (not shown). As shown in FIG. 3, a mounting member or sliding base 51 is mounted on guide shaft 50 and is slidable therealong in the axial direction of the shaft. In this regard, a tuning line 52, which is driven by the rotation of tuning knob 22, is fixed to a rear portion of sliding base 51 for moving the same along guide shaft 50. The front portion of sliding base 51 is disposed between upper and lower guide rails 26 and 27 in close proximity to the rear of dial plate 25, as shown in FIG. 2.

At upper and lower predetermined positions at the front of sliding base 51, there are disposed sliding members 51a and 51b for manual selection of the FM and AM broadcast stations. Sliding members 51a and 51b are virtually identical to sliding members 34a–43a and are slidable on respective resistive layers 31 and 32. Thus, sliding members 51a and 51b serve to detect the voltage corresponding to the received frequency at the contact position thereof with resistive layers 31 and 32, and have lead wires 53a and 53b connected thereto, in a similar manner as with wires 49a–49j to movable members 34a–43a, so as to supply the detected voltage to a voltage-variable capacitance element through a change-over switch. Since sliding members 51a and 51b are mounted on sliding base 51, if sliding base 51 is manually moved, that is, by rotating tuning knob 22, to thereby slide sliding members 51a and 51b on resistive layers 31 and 32, a desired broadcast station can manually be selected.

As shown in FIG. 2, on the front face of sliding base 51, is provided a display member 55, including a light emitting element 54 such as an LED, lamp or the like which acts as a broadcast station pointer. Display member 55 is disposed through a longitudinal slit 56 (FIG. 3) formed through the central portion of dial plate 25. Accordingly, by means of display member 55, the position of sliding base 51 in relation to markings 23 can manually be set so as to select a desired FM or AM station.

A catcher or sleeve member 57 is disposed within a bore 56' formed at the center of sliding base 51 and is keyed to guide shaft 50 such that sleeve member 57 is disposed for axial movement along the length of guide shaft 50, together with sliding base 51, and is disposed for rotation in the radial direction of guide shaft 50 when guide shaft 50 is so rotated. As shown in FIG. 3, sleeve member 57 is provided on its outer periphery with a projecting portion 57a, which is adapted to engage, or be inserted into, apertures 58 formed in the lower side plate 45 of each of FM/AM markers 34–43. Thus, when projecting portion 57a of sleeve member 57 is inserted into an aperture 58 of a marker, for example, marker 34, and sleeve member 57 is moved along guide shaft 50 in the axial direction thereof, marker 34 is translated with sleeve member 57 to a desired frequency position along dial plate 25. It is to be noted that, if display member 55, formed on the front face of sliding base 51, is translated so as to be aligned with pointer member 47 of one of the markers, for example, marker 34, projecting portion 57a of sleeve member 57 can be rotated in the clockwise direction in FIG. 2, and accurately be inserted into aperture 58 of marker 34. Of course, it is to be realized that such rotation of sleeve member 57 would be in the counter-clockwise direction of FIG. 2 in the case of AM markers 39–43.

Figure 4:
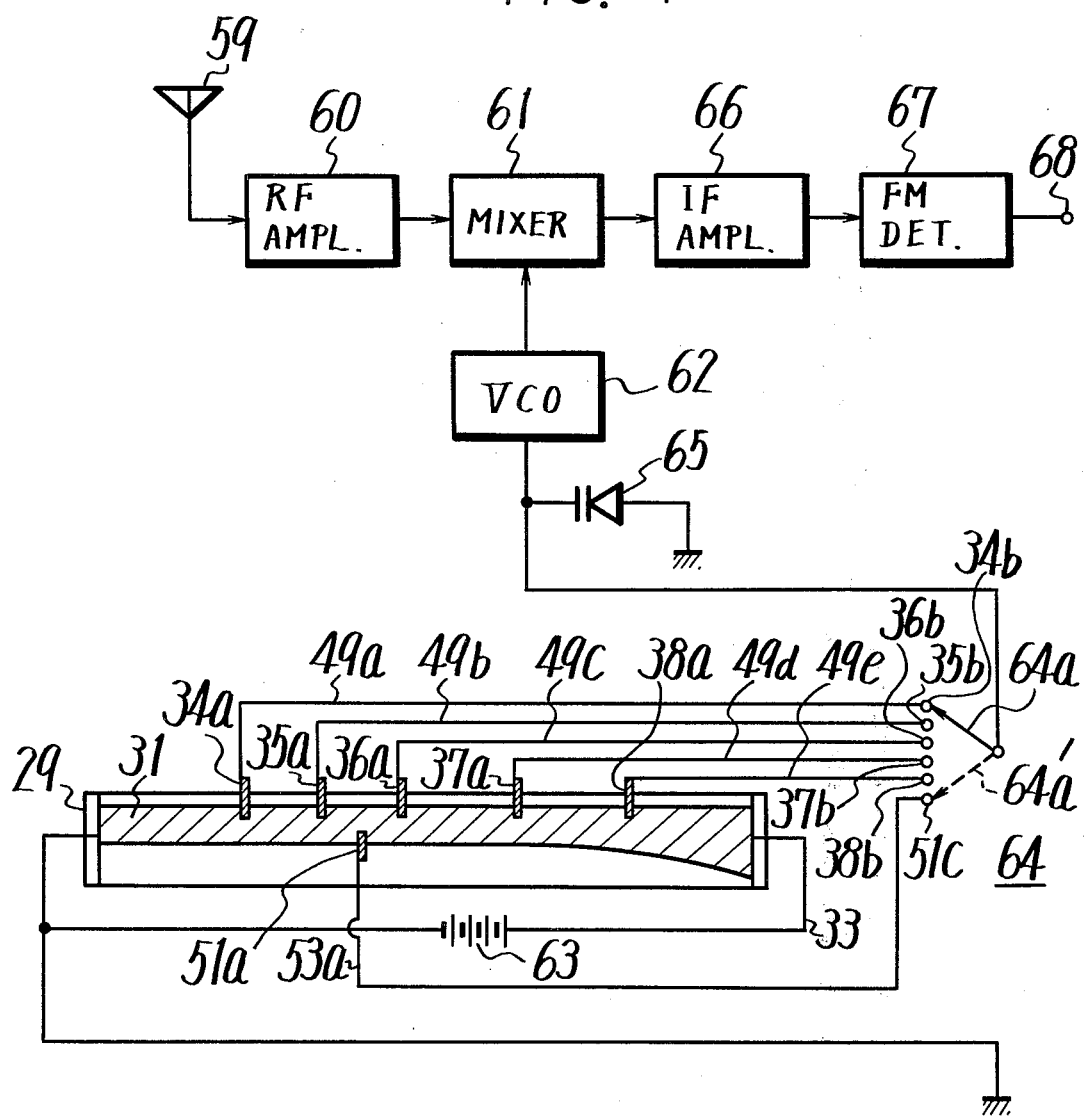
FIG. 4 is a block-circuit wiring diagram of a circuit that can be used with this invention.

Turning now to FIG. 4, an example of a circuit that can be used with the tuning apparatus of this invention, will be described. As shown therein, an FM signal is received by an antenna 59 and supplied through a high frequency (RF) amplifier 60 to a mixer circuit 61, where it is mixed with a local oscillation signal supplied from a voltage controlled oscillator (VCO) 62, to produce an intermediate frequency (IF) signal with a frequency of 10.7 MHz. This IF signal is delivered through an IF amplifier 66 and a frequency modulated (FM) signal detector 67 to an output terminal 68 as a detected output. Although this circuit is only shown in relation to the FM broadcast station, a similar circuit can be used to receive the AM stations.

For FM tuning, sliding members 34a–38a, which are provided on markers 34–38, slide on resistive layer 31 and detect voltages from a DC voltage source 63 connected between both ends of resistive layer 31, in which the detected voltages correspond to the sliding positions of movable members 34a–38a on resistive layer 31. In like manner, sliding member 51a, which is provided on the front portion of sliding base 51, similarly slides on resistive layer 31 to detect a predetermined voltage from DC voltage source 63 at its sliding position on resistive layer 31. The respective voltages detected by sliding members 34a–38a and sliding member 51a are delivered through lead wires 49a–49e and 53a to terminals 34b–38b and 51c, respectively. Terminals 34b–38b and 51c are selectively connected to VCO 62 by a movable contact 64a of a change-over or rotary switch 64, which is respectively switched in ganged relation to the first set of push-button switches 10–14 and manual push-button switch 20, shown in FIG. 1. The predetermined voltages supplied to the respective terminals 34b–38b and 51c are selectively supplied to a variable capacitance diode 65 serving as the voltage-variable capacitance element, the capacitance of which determines the oscillation frequency of the signal produced by VCO 62. Accordingly, VCO 62 performs its oscillation operation at an oscillation frequency determined by the contact positions of the respective sliding members 34a–38a and 51a with resistive layer 31 and thereby supplies the appropriate local oscillation signal to mixer circuit 61.

Turning now to the operation of the above-described tuning apparatus, a description will be given regarding the presetting of the respective markers and the selection of a desired station. Since the preset and tuning operations of the FM and AM stations are carried out in substantially the same manner, only the operation for the FM stations will be described.

In order to preset markers 34–38 for tuning one of five desired FM broadcast stations, power source switch 5 and manual tuning push-button switches 20 are actuated. When manual tuning switch 20 is depressed, movable contact 64a of change-over switch 64 contacts terminal 51c associated with sliding member 51a, as shown in FIG. 4 by the broken line at 64'a. Thus, variable capacitance diode 65 and sliding member 51a are electrically connected through switch 64 and lead wire 53a, such that the predetermined voltage detected by sliding member 51a at its contact position with resistive layer 31 is supplied to variable capacitance diode 65.

Then, before markers 34–38 are preset at desired positions along dial plate 25, corresponding to the desired frequencies, markers 34–38 grouped together at, for example, the right end position of indicator member 25, as shown by the dotted lines in FIG. 1. While display member 55 on the front face of sliding base 51 is observed, tuning knob 22 is rotated to move sliding base 51 along guide shaft 50 so as to align display member 55 with the left-most or first marker 34. In this manner, sleeve member 57, which is moved with sliding base 51 on guide shaft 50 is positioned beneath aperture 58 of first marker 34. Push-button switch 6 for FM tuning is then depressed, causing guide shaft 50 to rotate in the clockwise direction of FIG. 2. through a remote control mechanism, such as that shown in U.S. Pat. No. 4,167,702, which is incorporated herein by reference. Push-button switch 6 is of a self-returning type which allows it to automatically return to its initial or home position under the action of a spring, when depressed again. As guide shaft 50 rotates, projecting portion 57a of sleeve member 57 is caused to rotate in the same direction and is inserted within aperture 58 of first marker 34, as shown in FIG. 2, so as to be engaged therewith. After marker 34 has been engaged, tuning knob 22 is then rotated. As a result, with sleeve member 57 engaged with first marker 34, this marker moves along upper guide rail 26 relative to markings 23 on dial plate 25. During this time, sliding member 51a slides on resistive layer 31 and sequentially detects the changing control voltages corresponding to the received frequencies, so that the operator can determine and select the contact position for a desired broadcast station.

After the desired FM station is selected by the operation described above, push-button switch 6 is released or deactivated, causing guide shaft 50 to be rotated back to is original position. Thus, projecting portion 57a of sleeve member 57, which had been engaged within aperture 58 of first marker 34, becomes disengaged therefrom. As a result, the engagement of marker 34 with sleeve member 57 is released, and marker 34 is preset at the position associated with a desired FM station. Thus, even if sleeve member 57 is subsequently moved along guide shaft 50 in either direction, marker 34 remains fixed at its set position.

After first marker 34 has been preset by the above operation, sliding base 51 and sleeve member 57 are moved to the position of second marker 35 by the rotation of tuning knob 22, whereby display member 55 is aligned with pointer member 47 of second marker 35. Then, projecting portion 57a of sleeve member 57 is inserted within aperture 58 of second marker 35 by depressing push-button switch 6. Tuning knob 22 is again rotated and, in like manner, second marker 35 is moved to another desired tuning position and is preset at that position. The remaining markers 36–38 are preset at desired stations in a manner similar to the above operation. Markers 39–43 for AM tuning are also preset in a manner similar to the above operation. In the latter case, such presetting operation is carried out by means of AM push-button switch 7 and manual push-button switch 21. Thus, after markers 34–38 for FM tuning have been preset, markers 39–43 for AM tuning are preset. It is to be noted that when either of switches 6 or 7 for FM or AM tuning are depressed, projecting portion 57a of sleeve member 57 is rotated in the direction of markers 34–38 for FM tuning or markers 39–43 for AM tuning, respectively. Therefore, it is possible, for example, to preset first FM marker 34, then first AM marker 39, thereafter, second FM marker 35, and so on. An example of one distribution of markers 34-43 along dial plate 25 is shown in FIG. 1.

Once the desired FM and AM stations are preset, any one of these stations can automatically be selected. Such automatic selection occurs by merely depressing one of push-buttons switches 10-14 for selecting a desired FM station or switches 15-19 for selecting a desired AM station. Thus, for example, if switch 10 is depressed, movable arm 64a of change-over switch 64 is automatically connected to terminal 34b associated with first sliding member 34a, as shown in FIG. 4, which has previously been preset at a position corresponding to a desired broadcast station. The predetermined voltage at this preset position, where first sliding member 34a contacts resistive layer 31, can thus immediately be derived and applied through change-over switch 64 to variable capacitance diode 65. Accordingly, the oscillation frequency of the signal supplied by local oscillator 62 to mixer circuit 61, which is set by the capacitance of diode 65, is controlled so that the frequency corresponding to the above predetermined voltage can immediately be received. When one of AM station selection switches 15-19, for example, switch 15, is depressed, the DC voltage supplied to sliding member 39a of AM marker 39 is supplied to variable capacitance diode 65 through movable contact 64a the change-over switch 64 to select the desired AM station. Further, when a station other than those preset by FM markers 34-38 or AM markers 39-43, is desired to be received, either of push-button switches 20 or 21 for manual tuning is depressed and a desired station corresponding to the position of sliding member 51a can be selected.

Having described a specific preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:
1. A tuning apparatus comprising:
   a dial plate marked with broadcast frequencies thereon;
   a rotatably mounted guide shaft disposed parallel to said dial plate;
   mounting means slidably disposed for movement on said guide shaft;
   a display member extending from said mounting means toward said dial plate to indicate a manually selected broadcast frequency on said dial plate;
   sleeve means slidably mounted on said guide shaft, said sleeve means operatively interconnected with said mounting means and including a first engaging portion;
   tuning means operatively associated with said mounting means, display member and sleeve means for moving said mounting means, display member and sleeve means along said guide shaft responsive to operation of said tuning means;
   a resistive layer having varying resistance values distributed therealong which correspond to said broadcast frequencies on said dial plate, said resistive layer being supplied with a DC voltage at opposite ends thereof;
   a plurality of marker means, each including a second engaging portion slidably disposed with respect to said dial plate with each said marker means being adapted to indicate a predetermined broadcast frequency and each further including a first electrically conductive slide element for slidably contacting said resistive layer to detect one of a plurality of predetermined DC voltages in response to the location of said marker means; and
   control means for rotating said guide shaft to move said first engaging portion of said sleeve means from a first position remote from one of said plurality of marker means to a second position in operative engagement with said second engaging portion of said one of said plurality of marker means, said tuning means in cooperation with said control means being thereby capable of positioning said one of said plurality of marker means at a predetermined location along said dial plate corresponding to a desired broadcast frequency and of detecting a predetermined DC voltage in response to the location of said one of said one of said plurality of marker means, wherein said predetermined DC voltage is used as a tuning control voltage.

2. A tuning apparatus according to claim 1, in which each said slide element of said plurality of marker means is formed in a bent brush configuration.

3. A tuning apparatus according to claim 2, in which said mounting means further includes a second electrically conductive slide element for slidably contacting said resistive layer to detect a predetermined DC voltage in response to the location of said display member.

4. A tuning apparatus according to claim 3, further including a guide rail disposed parallel to said dial plate, and wherein said plurality of marker means are slidably disposed on said guide rail.

5. A tuning apparatus according to claim 4, in which the second engaging portion of each of said marker means is an aperture and said first engaging portion of said sleeve means is a projecting portion adapted to engage each said aperture.

6. A tuning apparatus comprising:
   a dial plate marked with broadcast frequencies thereon;
   a substrate having a resistive layer thereon, said resistive layer having varying resistance valves distributed therealong which correspond to said broadcast frequencies on said dial plate, said resistive layer also being supplied with a DC voltage at opposite ends thereof;
   a plurality of marker means slidably disposed with respect to said dial plate to indicate a predetermined broadcast frequency, each having a first electrically conductive slide element for slidably contacting said resistive layer to detect one of a plurality of predetermined DC voltages in response to the location of said marker means;
   mounting means slidably disposed in parallel with said dial plate, including a display member extending toward said dial plate to indicate a manually selected broadcast frequency, and a second electrically conductive slide element for slidably contacting said resistive layer to detect a predetermined DC voltage in response to the location of said mounting means; and
   switching means supplied with at least one of said predetermined DC voltages from said first and second slide elements and selectively supplying one of said predetermined DC voltages to a turning circuit as a tuning control voltage.

7. A tuning apparatus according to claim 6, further including:
an RF amplifier;
a voltage controlled oscillator having a variable capacitance diode supplied with said one of said predetermined DC voltages from said switching means;
a mixing circuit supplied with an output from said RF amplifier and said voltage controlled oscillator;
an IF amplifier connected to said mixer; and
a detecting circuit connected to said IF amplifier to demodulate an audio output signal.

8. A tuning apparatus according to claim 7, in which said variable capacitance diode has a non-linear voltage-capacitance characteristic, and said resistive layer has a non-linear resistance characteristic which varies in accordance with said voltage-capacitance characteristic of said variable capacitance diode.

9. A tuning apparatus according to claim 8, in which said switching means includes a rotary switch.

10. A tuning apparatus comprising:
a dial plate marked with broadcast frequencies for first and second frequency bands thereon;
first and second substrates having first and second resistive layers thereon, respectively, said resistive layers having varying resistance values distributed therealong which correspond to said broadcast frequencies on said dial plate, each said resistive layer also being supplied with a DC voltage at opposite ends thereof;
a first set of marker means associated with the first broadcast frequency band, said first set being slidably disposed with respect to said dial plate to indicate a predetermined broadcast frequency in the first frequency band and each said marker means of said first set having a first electrically conductive slide element for slidably contacting said first resistive layer to detect one of a plurality of predetermined DC voltages in response to the location of said marker means;
a second set of marker means associated with the second frequency band, said second set being slidably disposed with respect to said dial plate to indicate a predetermined broadcast frequency in the second frequency band and each said marker means of said second set having a second electrically conductive slide element for slidably contacting said second resistive layer to detect one of a plurality of predetermined DC voltage in response to the location of said marker means;
mounting means slidably disposed in parallel with said dial plate, including a display member extending therefrom toward said dial plate to indicate a manually selected broadcast frequency, and having third and fourth electrically conductive slide elements for slidably contacting said first and second resistive layers, respectively, to detect a predetermined DC voltage in response to the location of said mounting means; and
switching means supplied with at least one of said predetermined DC voltages from said first through fourth slide elements and selectively supplying one of said predetermined DC voltages to a tuning circuit as a tuning control voltage.

* * * * *